(12) United States Patent
Ishi et al.

(10) Patent No.: US 10,677,861 B2
(45) Date of Patent: Jun. 9, 2020

(54) MAGNETIC RESONANCE IMAGING APPARATUS

(71) Applicant: Toshiba Medical Systems Corporation, Otawara-shi (JP)

(72) Inventors: Keiichiro Ishi, Nasushiobara (JP); Hiroki Kondo, Nasushiobara (JP); Masaaki Umeda, Sakura (JP)

(73) Assignee: Canon Medical Systems Corporation, Otawara-shi (JP)

( * ) Notice: Subject to any disclaimer, the term of this patent is extended or adjusted under 35 U.S.C. 154(b) by 121 days.

(21) Appl. No.: 15/786,642

(22) Filed: Oct. 18, 2017

(65) Prior Publication Data

US 2018/0113180 A1  Apr. 26, 2018

(30) Foreign Application Priority Data

Oct. 21, 2016 (JP) .................... 2016-207171
Oct. 12, 2017 (JP) .................... 2017-198486

(51) Int. Cl.
*G01R 33/24* (2006.01)
*G01R 33/36* (2006.01)
*G01R 33/565* (2006.01)
*G01R 33/54* (2006.01)

(52) U.S. Cl.
CPC ....... *G01R 33/246* (2013.01); *G01R 33/3607* (2013.01); *G01R 33/543* (2013.01); *G01R 33/5659* (2013.01)

(58) Field of Classification Search
CPC .................................. G01R 33/246
USPC ................................ 324/306, 309
See application file for complete search history.

(56) References Cited

U.S. PATENT DOCUMENTS

| | | | | |
|---|---|---|---|---|
| 7,560,924 B2 * | 7/2009 | Kanda | ............. | G01R 33/56509 324/307 |
| 10,175,329 B2 * | 1/2019 | Kachi | ................. | G01R 33/246 |
| 10,247,803 B2 * | 4/2019 | Schmitter | ............ | G01R 33/543 |
| 2006/0261811 A1 | 11/2006 | Ham et al. | | |
| 2008/0129298 A1 * | 6/2008 | Vaughan | ............ | G01R 33/5612 324/322 |
| 2009/0137896 A1 | 5/2009 | Harvey et al. | | |

(Continued)

FOREIGN PATENT DOCUMENTS

| | | |
|---|---|---|
| JP | 2006-508759 | 3/2006 |
| JP | 2008-514259 | 5/2008 |

(Continued)

*Primary Examiner* — Vincent Q Nguyen
(74) *Attorney, Agent, or Firm* — Oblon, McClelland, Maier & Neustadt, L.L.P.

(57) ABSTRACT

According to one embodiment, a magnetic resonance imaging apparatus includes processing circuitry and sequence control circuitry. The processing circuitry specifies a position of an imaging target of a subject in a bore, using an image collected by a first imaging protocol. The processing circuitry determines, in accordance with the specified position, a correction value for a phase of an RF pulse and/or a correction value for an amplitude of the RF pulse, the RF pulse being related to a transmit RF wave, so that non-uniformity in a magnetic field of the transmit RF wave transmitted to the imaging target can be corrected. The sequence control circuitry executes a second imaging protocol for the subject, using the determined correction value.

11 Claims, 7 Drawing Sheets

(56) References Cited

U.S. PATENT DOCUMENTS

2011/0101980 A1\* 5/2011 Ohiwa ............... G01R 33/4833
                                                        324/309
2011/0121829 A1   5/2011 Umeda et al.

FOREIGN PATENT DOCUMENTS

| JP | 2011-131045 | 7/2011 |
| JP | 2016-097162 | 5/2016 |

\* cited by examiner

| Distance (d) | B1 Correction values ||
| --- | --- | --- |
| | Phase (Φ) | Amplitude (A) |
| d1 | Φ1 | A1 |
| d2 | Φ2 | A2 |
| ⋮ | ⋮ | ⋮ |

MAGNETIC RESONANCE IMAGING APPARATUS

CROSS-REFERENCE TO RELATED APPLICATIONS

This application is based upon and claims the benefit of priority from the prior Japanese Patent Application No. 2016-207171, filed Oct. 21, 2016, and No. 2017-198486, filed Oct. 12, 2017, the entire contents of both of which are incorporated herein by reference.

FIELD

The present embodiment relates to a magnetic resonance imaging apparatus.

BACKGROUND

A magnetic resonance imaging (MRI) apparatus corrects a transmit radio frequency (RF) magnetic field, in other words, performs B1 shimming, using a pair of B1 correction values (for example, B1 correction values for a phase and an amplitude of output of an RF amplifier related to a transmit RF wave), which are predetermined for each part to be imaged to correct non-uniformity of the transmit RF magnetic field (B1) due to a transmit RF wave.

When performing B1 shimming for an imaging target having high flexibility in positioning in the bore of the MRI apparatus, the position of the imaging target in the bore may vary from individual to individual. Since B1 shimming uses one type of correction value for each imaging target as described above, non-uniformity of B1 due to the position of the imaging target in the bore may not be completely corrected; as a result, brightness irregularity may occur in an MRI image.

B1 shimming may be performed using a spatial distribution of B1 obtained by pre-scanning performed before main scanning for each patient. However, from the viewpoint of avoiding extending the time required for imaging, it is not preferable to perform pre-scanning for the purpose of obtaining a spatial distribution of B1.

An objective is to perform B1 shimming appropriately for an imaging target placed in the bore.

DETAILED DESCRIPTION

In general according to one embodiment, a magnetic resonance imaging apparatus includes processing circuitry and sequence control circuitry. The processing circuitry specifies a position of an imaging target (a target for imaging) of a subject in a bore, using an image collected by a first imaging protocol. The processing circuitry determines, in accordance with the specified position, a correction value for a phase and/or a correction value for an amplitude of an RF pulse, the RF pulse being related to a transmit RF wave, so that non-uniformity in a magnetic field of the transmit RF wave transmitted to the imaging target can be corrected. The sequence control circuitry executes a second imaging protocol for the subject, using the determined correction value.

The magnetic resonance imaging apparatus according to the present embodiment will be described with reference to the drawings. In the description below, structural elements having substantially the same functions and configurations will be denoted by the same reference symbols, and a repetitive description of such elements will be given only where necessary.

Figure 1:
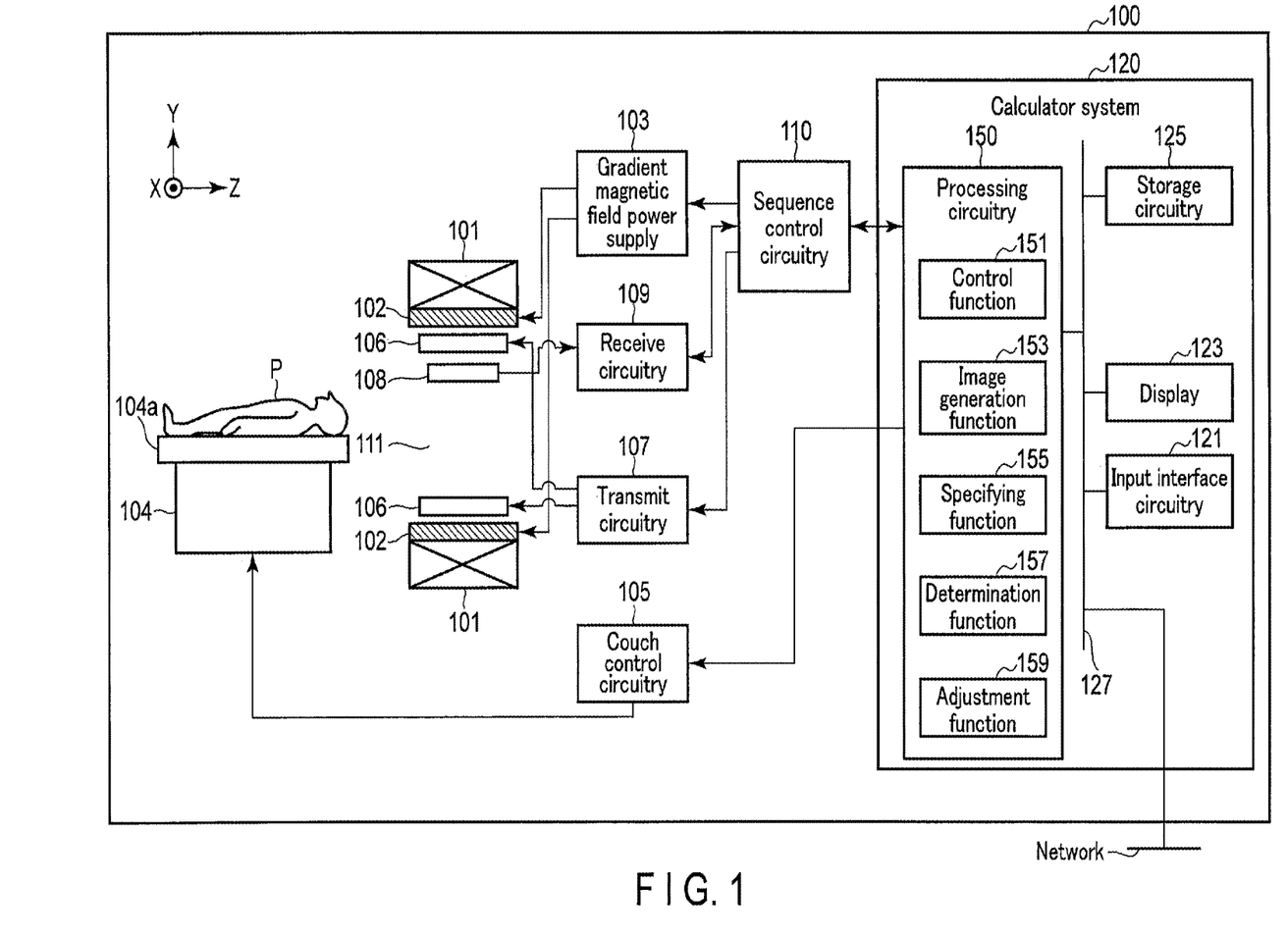
FIG. 1 is a diagram illustrating an example of the configuration of a magnetic resonance imaging apparatus according to an embodiment.

First, the configuration of the magnetic resonance imaging (MRI) apparatus according to the present embodiment is described with reference to FIG. 1. FIG. 1 is a diagram showing the configuration of the MRI apparatus 100 according to the embodiment. As shown in FIG. 1, the MRI apparatus 100 includes a static magnetic field magnet 101, a gradient coil 102, a gradient magnetic field power supply 103, a couch 104, couch control circuitry 105, a transmit RF coil 106, transmit circuitry 107, a receive RF coil 108, receive circuitry 109, sequence control circuitry 110, and a calculator system 120. The MRI apparatus 100 may have a hollow, cylindrical-shaped shim coil provided between the static magnetic field magnet 101 and the gradient coil 102.

The static magnetic field magnet 101 is a magnet formed in a hollow, cylindrical shape, and generates a uniform static magnetic field (B0) in its inner space. As the static magnetic field magnet 101, a superconductive magnetic is used, for example.

The gradient coil 102 is a hollow, cylindrical-shaped coil, and it is located inside the static magnetic field magnet 101. The gradient coil 102 is formed by combining three coils respectively corresponding to the X-, Y-, and Z-axes which are orthogonal to each other. The Z-axis direction is defined as the same as the direction of the static magnetic field. In addition, the Y-axis direction is a vertical direction, and the X-axis direction is a direction perpendicular to each of the Z-axis and the Y-axis. These three coils in the gradient coil 102 are separately supplied with a current from the gradient magnetic field power supply 103, and generate a gradient magnetic field in which the magnetic field intensity changes along each of the X-, Y-, and Z-axes.

The gradient magnetic field power supply 103 is an apparatus that supplies a current to the gradient coil 102 under the control of the sequence control circuitry 110.

The couch 104 is an apparatus having the couch top 104a on which a subject P is laid. The couch 104 inserts the couch top 104a on which the subject P is laid into the bore 111 under the control of the couch control circuitry 105. Normally, the couch 104 is installed in an examination room where the MRI apparatus 100 is installed, in such a manner that the longitudinal axis of the couch 104 is parallel to the center axis of the static magnetic field magnet 101.

The couch control circuitry 105 is circuitry for controlling the couch 104, and is realized by a processor, for example. The couch control circuitry 105 drives the couch 104 in accordance with an operator's instruction via the input interface circuitry 121 to move the couch top 104a in a longitudinal direction and a vertical direction.

The transmit RF coil 106 is a coil located inside the gradient coil 102. The RF coil 106 is supplied with an RF pulse from the transmit circuitry 107, and generates a transmit RF wave. A transmit RF wave is equivalent to a high-frequency magnetic field (B1). The transmit RF coil 106 has a plurality of coils corresponding to the number of channels, for example.

The transmit circuitry 107 supplies an RF pulse corresponding to a Larmor frequency to the transmit RF coil 106 by the control of the sequence control circuitry 110. The transmit circuitry 107 has a number of transmit sources in accordance with the number of channels. The transmit circuitry 107 corresponds to a transmit unit.

Figure 2:
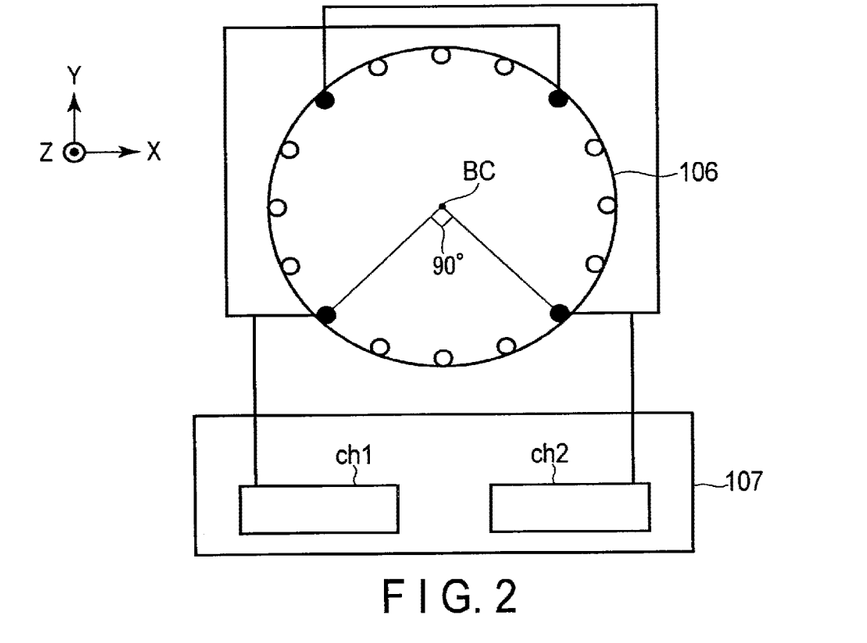
FIG. 2 is a diagram illustrating an example of a transmit RF coil and transmit circuitry according to the embodiment.

FIG. 2 is a diagram illustrating an example of the transmit RF coil 106 and the transmit circuitry 107. As shown in FIG. 2, the transmit RF coil 106 is a two-channel whole-body quadrature (QD) coil. The whole-body QD coil is located for each channel at a position displaced 90 degrees off with respect to the magnetic field center BC. The transmit RF coil 106 is not limited to a whole-body QD coil, and it may be any one-channel or multiple-channel transmit RF coil. The transmit RF coil 106 is not limited to a QD coil, and it may be any transmit RF coil. The transmit circuitry 107 shown in FIG. 2 has transmit sources for respective channels. "Ch1" shown in FIG. 2 is a transmit source for the first channel, and "Ch2" is a transmit source for the second channel.

The receive RF coil 108 is a coil located inside of the gradient coil 102, and receives a magnetic resonance signal emitted from a subject P by the RF magnetic field. The receive RF coil 108 outputs the received magnetic resonance signal to the receive circuitry 109. The receive RF coil 108 is, for example, a coil array having one or more coils, typically a number of coils. In FIG. 1, the transmit RF coil 106 and the receive RF coil 108 are illustrated as separate RF coils; however, the transmit RF coil 106 and the receive RF coil 108 may be realized by an integrated transmit/receive RF coil.

The receive circuitry 109 has a processor that generates MR data based on a magnetic resonance signal that is output from the receive RF coil 108 by the control of the sequence control circuitry 110. The receive circuitry 109 transmits the generated MR data to the sequence control circuitry 110. The MR data generated by the receive circuitry 109 may be called raw data.

The sequence control circuitry 110 controls the gradient magnetic field power supply 103, the transmit circuitry 107, and the receive circuitry 109 in accordance with an imaging protocol transmitted from the calculator system 120, and performs imaging on a subject P. An imaging protocol has different pulse sequences in accordance with a type of examination. In an imaging protocol, defined are a value of a current supplied from the gradient magnetic field power supply 103 to the gradient coil 102, timing of supplying a current by the gradient magnetic field power supply 103 to the gradient coil 102, a magnitude of an RF pulse supplied from the transmit circuitry 107 to the transmit RF coil 106, timing of supplying an RF pulse from the transmit circuitry 107 to the transmit RF coil 106, timing of detecting an MR signal by the receive circuitry 109, and the like. The sequence control circuitry 110 is an example of the sequence controller.

The calculator system 120 is an apparatus that performs overall control, data collection, and image reconstruction in the MRI apparatus 100. The calculator system 120 includes input interface circuitry 121, a display 123, storage circuitry 125, and processing circuitry 150. The input interface circuitry 121, the display 123, the storage circuitry 125, and the processing circuitry 150 are connected via buses 127. Physiological signal measuring devices and external storage devices are connected to the calculator system 120 via a communication interface and network, as needed. For example, the calculator system 120 is connected to a radiology information system (RIS), a picture archiving and communication system (PACS), and other similar systems, via a network.

The input interface circuitry 121 is circuitry for receiving various instructions and information inputs from an operator. The input interface circuitry 121 is circuitry for a pointing device, such as a mouse and a track ball, or for an input device, such as a keyboard, etc. The input interface circuitry 121 is not limited to circuitry for physical operation devices, such as a mouse and a keyboard. The input interface circuitry 121 also includes, for example, electric signal processing circuitry that receives an electric signal corresponding to an input operation through an external input device provided separately from the present MRI apparatus 100, and outputs the received electric signal to various circuitry. The input interface circuitry 121 is an example of an input unit.

Under the control of the control function 151 in the processing circuitry 150, the display 123 displays various types of information, such as an MR image reconstructed by the image generation function 153. The display 123 is, for example, a CRT display, a liquid crystal display, an organic EL display, an LED display, a plasma display, or any other display known in this technical field. The display 123 is an example of a display unit.

The storage circuitry 125 stores data, such as the MR data received via the sequence control circuitry 110, and the image data generated by the image generation function 153. The storage circuitry 125 stores the center of a magnetic field BC in the bore 111 of the gantry of the MRI apparatus 100 in a form of a coordinate in the bore 111, for example. The storage circuitry 125 stores a predetermined pair of B1 correction values for each part to be imaged in order to correct non-uniformity of the transmit RF magnetic field (B1) due to a transmit RF wave transmitted from the transmit RF coil 106. The B1 correction values are those for a phase and an amplitude of an RF pulse that is output from the transmit circuitry 107, and they are defined for each part to be imaged. The storage circuitry 125 stores various imaging protocols. The storage circuitry 125 stores conditions for imaging, including a plurality of imaging parameters that define imaging protocols. The storage circuitry 125 stores programs corresponding to the various functions executed by the processing circuitry 150. For example, the storage circuitry 125 may be realized by a semiconductor memory element, such as a RAM (Random Access Memory) and a flash memory, a hard disk drive, a solid state drive, and an optical disk, etc. The storage circuitry 125 may have a driver which writes and reads information to and from portable memories, such as a CD-ROM drive, a DVD drive, and a flash memory. The storage circuitry 125 is an example of a storage unit.

The processing circuitry 150 includes a not-shown processor and a not-shown memory, such as a ROM or a RAM, as hardware resources to control the MRI apparatus 100 integrally. For example, the processing circuitry 150 includes a control function 151, an image generation function 153, a specifying function 155, a determination function 157, and an adjustment function 159. The various functions, which are achieved by the control function 151, the image generation function 153, the specifying function 155, the determination function 157, and the adjustment function 159, are stored in the storage circuitry 125 in a form of a computer-executable program. The processing circuitry 150 is a processor which reads a program corresponding to each function from the storage circuitry 125 and executes the program to realize the function corresponding to the program. In other words, the processing circuitry 150 in a state where each of the programs is read has each of the functions shown in the processing circuitry 150 of FIG. 1.

It was described with reference to FIG. 1 that those functions are realized in single processing circuitry 150; however, a plurality of independent processors may be combined to constitute the processing circuitry 150, and the functions may be realized by a program by each of the processors. In other words, each of the above-mentioned functions may be configured as a program, and single processing circuitry executes each program, or a specific function may be implemented in exclusive, independent program-execution circuitry. The control function 151, the image generation function 153, the specifying function 155, the determination function 157, the adjustment function 159 of the processing circuitry 150 are examples of a control unit, an image generation unit, a specifying unit, a determination unit, and an adjustment unit, respectively.

The term "processor" used in the above description means, for example, a CPU (Central Processing Unit), a GPU (Graphical Processing Unit), or circuitry such as an ASIC (Application Specific Integrated Circuit), or a programmable logic device (e.g. SPLD (Simple Programmable Logic Device), CPLD (Complex Programmable Logic Device), or a FPGA (Field Programmable Gate Array)).

The processor realizes its function by reading and executing a program stored in the storage circuitry 125. Instead of storing a program on the storage circuitry 125, the program may be directly integrated into the circuitry of the processor. In this case, the function is realized by reading and executing the program integrated into the circuitry. Similarly, each of the couch control circuitry 105, the transmit circuitry 107, the receive circuitry 109, and the sequence control circuitry 110, etc. are also configured as an electronic circuit, such as the above processor.

The processing circuitry 150 integrally controls the MRI apparatus 100 by the control function 151. Specifically, the processing circuitry 150 reads a control program stored in the storage circuitry 125 and expands it in the memory, and controls each circuitry of the MRI apparatus 100 in accordance with the expanded control program. For example, by the control function 151, the processing circuitry 150 reads an imaging protocol from the storage circuitry 125 based on conditions for imaging that are input by an operator through the input interface circuitry 121. The processing circuitry 150 may also generate an imaging protocol based on conditions for imaging. The processing circuitry 150 transmits the imaging protocol to the sequence control circuitry 110 to control imaging of the subject P. The processing circuitry 150 receives MR data from the sequence control circuitry 110, and stores the received MR data in the storage circuitry 125.

By the image generation function 153, the processing circuitry 150 performs a Fourier transform on the MR data, thereby generating an MR image. The processing circuitry 150 outputs an MR image to the display 123 and the storage circuitry 125. The processing circuitry 150 has a function of performing B1 shimming, without pre-scanning for generating a map of a transmit RF magnetic field (a B1 map), for correcting non-uniformity of the transmit RF magnetic field (hereinafter, "B1 shimming function"). The B1 shimming function has, for example, the specifying function 155, the determination function 157, and the adjustment function 159. These functions will be described later in detail in the explanation of the B1 shimming function.

The overall configuration of the MRI apparatus 100 according to the present embodiment has been described above. Hereinafter, the present embodiment will be explained in detail. An imaging target in the present embodiment is a part having high flexibility in positioning in the bore of the gantry in the MRI apparatus 100. For a more specific explanation, suppose the imaging target is one knee of the subject P hereinafter. The imaging target in the present embodiment is not limited to the knees. An imaging target other than the knees will be explained in the later-described applied examples.

The storage circuitry 125 stores a correspondence table used in processing relating to the later-described B1 shimming function. The correspondence table is, for example, a look-up table of B1 correction values corresponding to positions of an imaging target of a subject P in the bore 111 (the B1 correction values for both of a phase and an amplitude, for a phase only, or for an amplitude only). The correspondence table is generated based on an experiment using a phantom, etc., or a simulation, for example. The storage circuitry 125 stores a correspondence table generated in advance. The correspondence table will be described later in detail.

Figure 3:
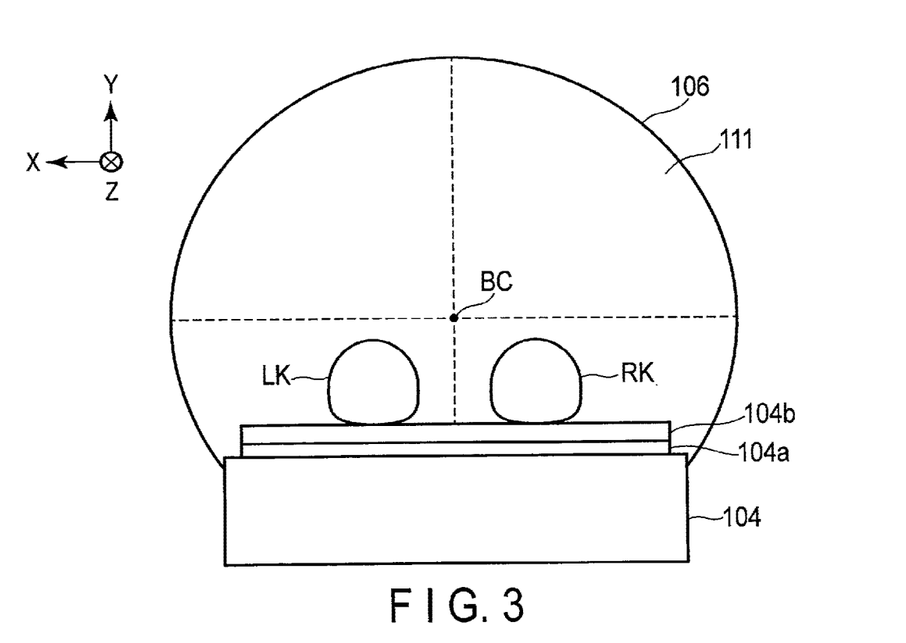
FIG. 3 is a diagram illustrating an example of the cross section of both knees of a subject inserted into the bore from the foot side of the object.

FIG. 3 is a diagram illustrating an example of the cross section of both knees of a subject P feet-first inserted into the bore 111. In FIG. 3, the right knee RK and the left knee LK are laid on the pad 104b placed on the couch top 104a, in parallel to the X-axis direction (the horizontal direction). If the imaging target is one knee of the subject P, the target knee may be bent when performing imaging in order to avoid obstruction to the image of the target knee by the non-target knee, and to prevent a wraparound due to the non-target knee being in the image of the target knee. In addition, the target knee may be bent in the bore so that the anterior cruciate ligament in the target knee can be clearly depicted. To allow the knee to be bent, an additional pad thicker than the pad 104b is placed under the knee. In the following description, suppose the imaging target is the left knee of the subject P.

Figure 4:
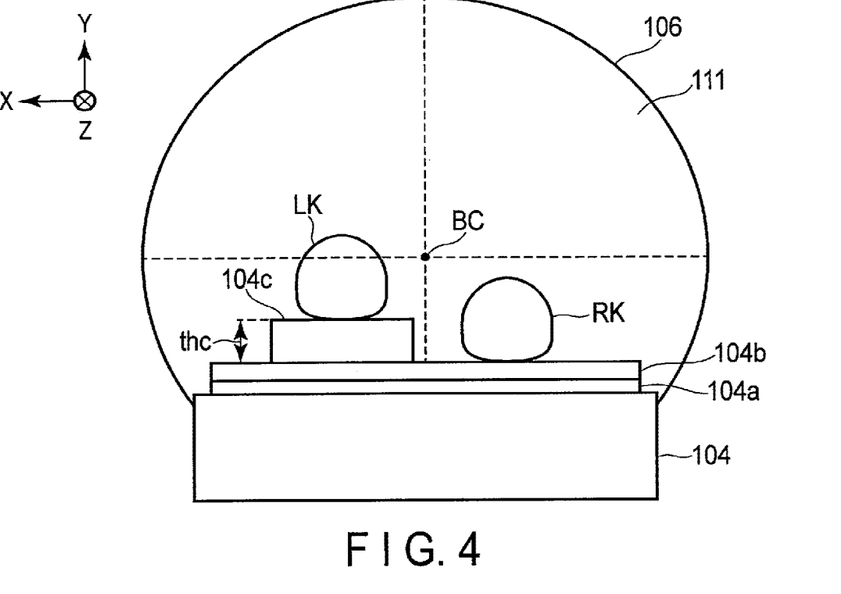
FIG. 4 is a diagram illustrating, with the right knee, the left knee laid on a pad placed on another pad on the couch top in the embodiment.
Figure 5:
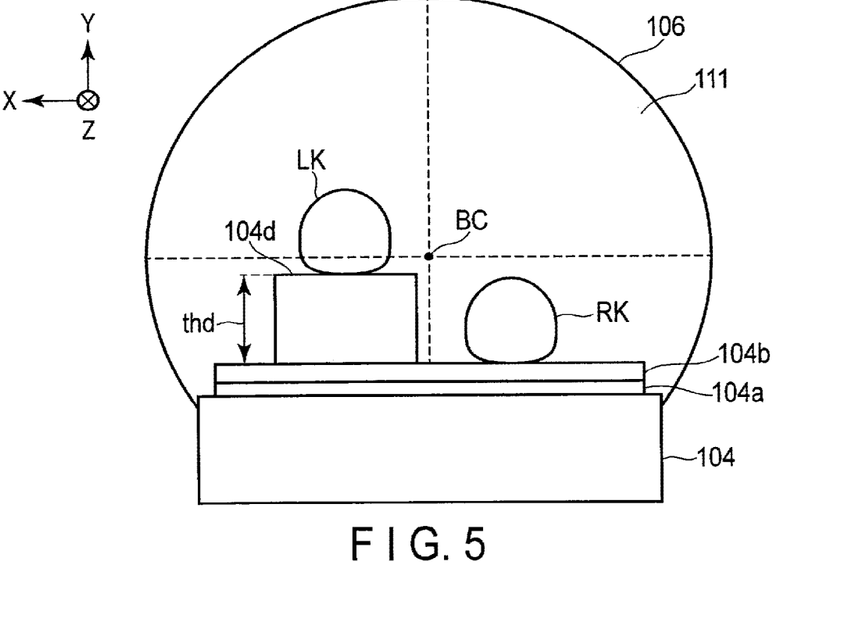
FIG. 5 is a diagram illustrating the left knee laid on a pad placed on another pad on the couch top in the embodiment, with the right knee.

FIG. 4 is a diagram illustrating the left knee LK laid on the pad 104c placed on the pad 104b, with the right knee RK. FIG. 5 is a diagram illustrating the left knee LK laid on the pad 104d placed on the pad 104b, with the right knee RK. As shown in FIGS. 4 and 5, the thickness (thc) of the pad 104c is thinner than the thickness (thd) of the pad 104d. A pad to be additionally placed on the pad 104b (i.e., the pad 104c, the pad 104d, etc.) is selected by the operator as needed, and is placed on the pad 104b. Hereinafter, suppose the pad 104c is placed on the pad 104b in the present embodiment.

(B1 Shimming Function)

Figure 6:
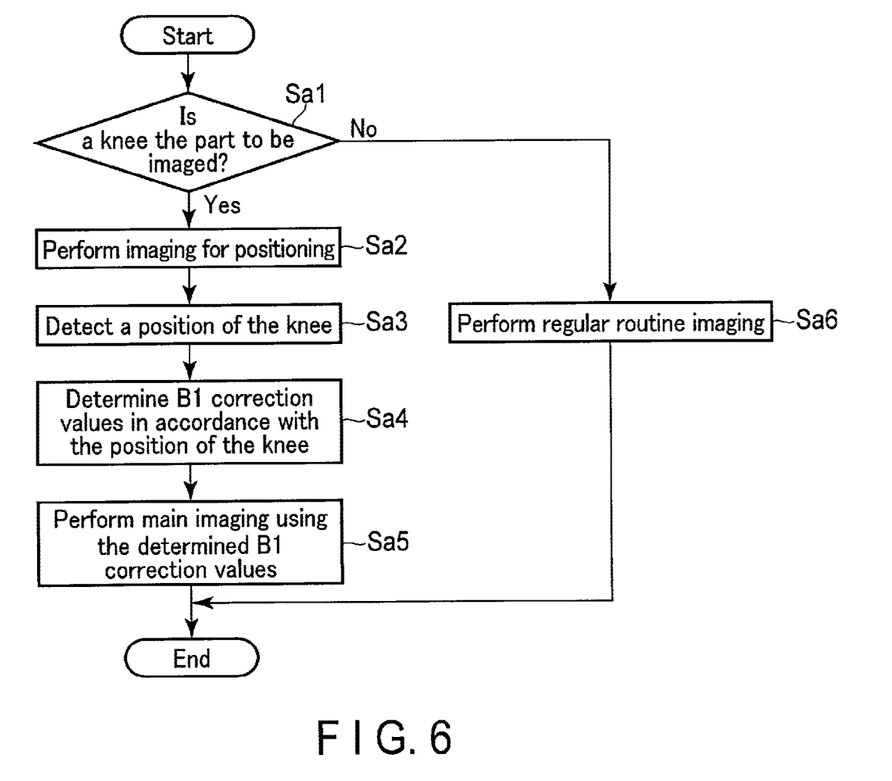
FIG. 6 is a flowchart illustrating an example of a processing procedure of the B1 shimming function according to the embodiment.

FIG. 6 is a flowchart illustrating an example of a process procedure of the B1 shimming function according to the present embodiment.

(Step Sa1)

A part which is an imaging target is input through the input interface circuitry 121. Instead of inputting an imaging target, an instruction to select an imaging protocol for an imaging target may be input. Since an imaging protocol is associated with a target part to be imaged, the instruction to select an imaging protocol is equivalent to an input of a part of an imaging target. If a target part to be imaged having high positioning-flexibility is input, the process in step Sa2 is carried out. In FIG. 6, a target part to be imaged having high positioning-flexibility is, for example, a knee. After or before inputting an instruction to select a target part for imaging, the pad 104c is placed on the pad 104b, and the subject P is laid on the pad 104b placed on the couch top 104a. At this time, the left knee of the subject P is placed on the pad 104c.

If a target part to be imaged having low positioning-flexibility is input, the process in step Sa6 is carried out. A target part to be imaged having low positioning-flexibility is, for example, the head, the neck, the chest, and the abdomen. The process in step Sa2 and thereafter may be performed even for a part having low flexibility in positioning. This case will be later explained in the applied examples.

After the target part to be imaged is input, conditions for imaging are set and input through the input interface circuitry 121. By the control function 151, the processing circuitry 150 reads an imaging protocol from the storage circuitry 125 based on the target part to be imaged and the conditions of imaging. Hereinafter, for a specific explanation, suppose there are two types of imaging protocol that is read from the storage circuitry 125, i.e., a first imaging protocol and a second imaging protocol. The first imaging protocol is an imaging protocol carried out to generate images that are used in positioning (locator) for main imaging. In other words, the first imaging protocol is an imaging protocol related to imaging for positioning which is performed before main imaging. The second imaging protocol is an imaging protocol for performing the main imaging for an imaging target at the imaging position that is set based on positioning images. The processing circuitry 150 may also read a different imaging protocol from the storage circuitry 125, other than the first and second imaging protocols. For example, the other imaging protocol is a third imaging protocol for generating a map indicating spatial sensitivity of the receive RF coil 108 (hereinafter, referred to as a sensitivity map).

(Step Sa2)

After the process in step Sa1, the imaging target is inserted into the bore. If an instruction to start imaging for positioning is input through the input interface circuitry 121, the sequence control circuitry 110 carries out imaging for positioning on the imaging target in accordance with the first imaging protocol. By the image generation function 153, the processing circuitry 150 generates positioning images based on the MR data obtained by the imaging for positioning. The positioning images are images collected by the first positioning protocol and for determining an imaging position for the second imaging protocol. The positioning images are, for example, orthogonal three cross-sectional images or orthogonal two cross-sectional images for the knee as the imaging target. The orthogonal three cross-sectional images are an axial image (a body-axial cross-sectional image), a coronal image (a coronal cross-sectional image), and a sagittal image (a sagittal cross-sectional image) of the knee. The orthogonal two cross-sectional images are an axial image and a coronal image. The processing circuitry 150 outputs the positioning images to the display 123. The display 123 displays the positioning images.

Figure 7:
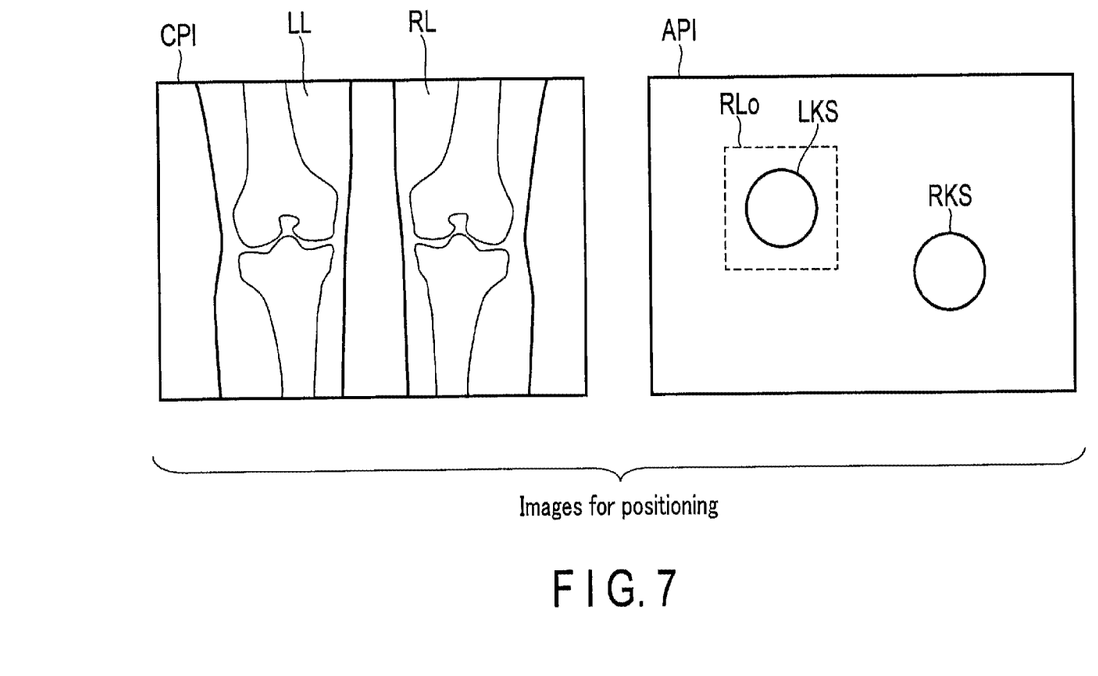
FIG. 7 is a diagram illustrating an example of positioning images displayed on a display in the embodiment.

FIG. 7 is a diagram illustrating an example of positioning images displayed on the display 123. The positioning images shown in FIG. 7 are orthogonal two cross-sectional images of the knee. The coronal image CPI in FIG. 7 is an image of part of the lower legs of the subject P including the knees (the left leg part LL and the right leg part RL). The axial image API in FIG. 7 includes cross sections of both knees of the subject P (the left knee cross section LKS and the right knee cross section RKS). In the positioning images in FIG. 7, an imaging position for main imaging is input in accordance with an operator's instruction through the input interface circuitry 121. A field of view (FOV) for the main imaging is set by the input of the imaging position.

To obtain more detailed positioning images, a region RLo for which the first imaging protocol is once again executed may be set in the axial image API. The region RLo is a region for which imaging for positioning is carried out for the second time in accordance with the first imaging protocol.

Figure 8:
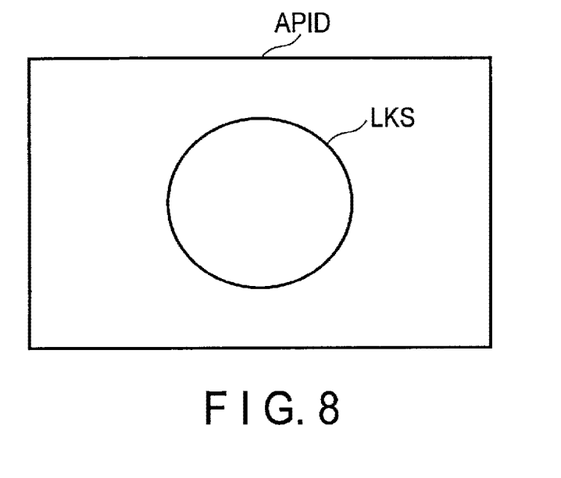
FIG. 8 is a diagram illustrating an example of a positioning image generated by imaging for positioning performed for the second time in the embodiment.

FIG. 8 is a drawing illustrating an example of the positioning image APID generated by the imaging for positioning performed for the second time. The positioning image APID shown in FIG. 8 is an image in an imaging range narrower than the imaging range of the axial image API in FIG. 7. The positioning image APID is a positioning image used for more detailed positioning (hereinafter, detailed positioning image). Although FIG. 8 shows the positioning image in the axial cross section, the orthogonal three cross-sectional images or orthogonal two cross-sectional images are displayed on the display 123 during the imaging for positioning performed for the second time. The detailed positioning image APID is output from the processing circuitry 150 to the display 123, and displayed on the display 123. At this time, in the displayed detailed positioning image APID, an imaging position for the main imaging is input in accordance with an operator's instruction through the input interface circuitry 121. The FOV for the main imaging is set by the input of the imaging position.

(Step Sa3)

After performing imaging for positioning, the processing circuitry 150 specifies, by the specifying function 155, the position of the imaging target (the knee) of the subject P in the bore 111 based on the positioning image. Hereinafter, as an example, suppose the positioning image used by the specifying function 155 is the axial image API shown in FIG. 7.

By the specifying function 155, the processing circuitry 150 specifies a relative position relationship between the knees of the subject P, that is, one knee (e.g., LKS) which is the imaging target and the other knee (e.g., RKS), which is not the imaging target, in the axial image API shown in FIG. 7. More specifically, the processing circuitry 150 detects the outline of each of the knees by an image processing function, such as edge detecting processing, in the axial image API shown in FIG. 7. Subsequently, the processing circuitry 150 specifies a center point of the knee which is the imaging target based on the outline of the targeted knee in the axial image API shown in FIG. 7. The processing circuitry 150 may specify a point of a center of gravity, instead of a center point. As the above-mentioned relative position relationship, the processing circuitry 150 specifies the distance from the horizontal line passing the lower edge of the outline of the non-targeted knee to the center point of the targeted knee.

The relative position relationship is not limited to the distance. For example, as the relative position relationship, the processing circuitry 150 may specify an angle between the horizontal line and the straight line connecting the center point of the targeted knee and the center point of the non-targeted knee. In this case, the processing circuitry 150 specifies the center point of the non-targeted knee based on the outline of the non-targeted knee in the axial image API shown in FIG. 7.

Figure 9:
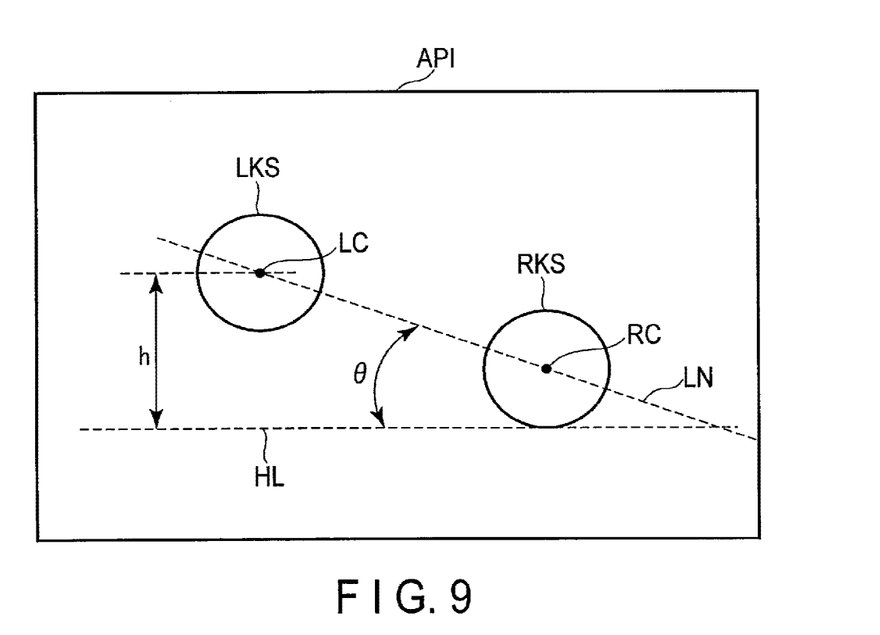
FIG. 9 is a diagram illustrating an example of a relative position relationship between the knee of a subject as an imaging target and the other knee which is not an imaging target in the embodiment.

FIG. 9 is a diagram illustrating an example of a relative position relationship between the knee (LKS) of a subject P as an imaging target and the other knee which is not an imaging target (RKS). As shown in FIG. 9, the outlines of both of the knees are detected in the axial image API. The broken line HL shown in FIG. 9 is the horizontal line. The point LC in FIG. 9 indicates the center point of the left knee LKS which is the imaging target. The double-ended arrow h in FIG. 9 indicates a distance (height) from the horizontal line HL passing the lower edge of the outline of the non-targeted knee to the center point LC of the left-targeted left knee. The point RC in FIG. 9 indicates the center point of the right knee RKS which is the imaging target. The broken line LN shown in FIG. 9 is a straight line connecting the center point LC of the targeted left knee and the center point RC of the non-targeted right knee. The symbol e in FIG. 9 indicates an angle between the straight line LN and the horizontal line HL.

Specifying the position of the imaging target in the subject P in the bore 111 is not limited to specifying the relative position relationship. For example, the processing circuitry 150 may specify, by the specifying function 155, the position of the targeted left knee of the subject P in the bore 111 as a coordinate in the bore 111, based on the center point LC of the targeted left knee and the coordinate of the center of the magnetic field BC. If the center position of the axial image API corresponds to the center of the magnetic field BC, the processing circuitry 150 specifies the position of the targeted left knee of the subject P in the bore 111, based on the center point LC of the targeted left knee and the coordinate of the center position of the axial image API. The processing circuitry 150 may specify the position of the imaging target based on information of an imaging position that is input in the positioning image, that is, information of the FOV in the positioning image. Specifically, the processing circuitry 150 specifies a coordinate of the targeted left knee, using a coordinate of the FOV in the positioning image.

As a positioning image used by the specifying function 155, the detailed positioning image APID shown in FIG. 8 may be used. At this time, the processing circuitry 150 specifies the position of the targeted left knee of the subject P in the bore 111 as a coordinate in the bore 111, based on the center point LC of the targeted knee in the detailed positioning image APID and the coordinate of the center of the magnetic field BC.

The processing circuitry 150 may output a result of the detection of the knee position (the outline of the knee, the center point of the knee which indicates the knee position, etc.) to the display 123. The display 123 displays a result of the detection of the knee position on the positioning image. At this time, the result of the detection of the knee position can be corrected as needed by an operator's instruction to correct the result through the input interface circuitry 121, a graphical user interface (GUI), or the like.

(Step Sa4)

After specifying the position of the imaging target, in order to correct the non-uniformity in the magnetic field of the transmit RF wave transmitted to the imaging target, the processing circuitry 150 determines, by the determination function 157, a correction value for a phase and/or a correction value for an amplitude of an RF pulse related to the transmit RF wave, in accordance with the specified position. Specifically, the processing circuitry 150 reads from the storage circuitry 125 a correspondence table of B1 correction values for the specified position. Subsequently, the processing circuitry 150 determines a correction value for the phase and/or a correction value for the amplitude based on the position specified by the specifying function 155 and the correspondence table. If a relative position relationship is specified by the specifying function 155, the processing circuitry 150 determines the B1 correction values, using the correspondence table of B1 correction values for the relative position relationship (angle θ or distance d) and the specified relative position relationship.

Figure 10:
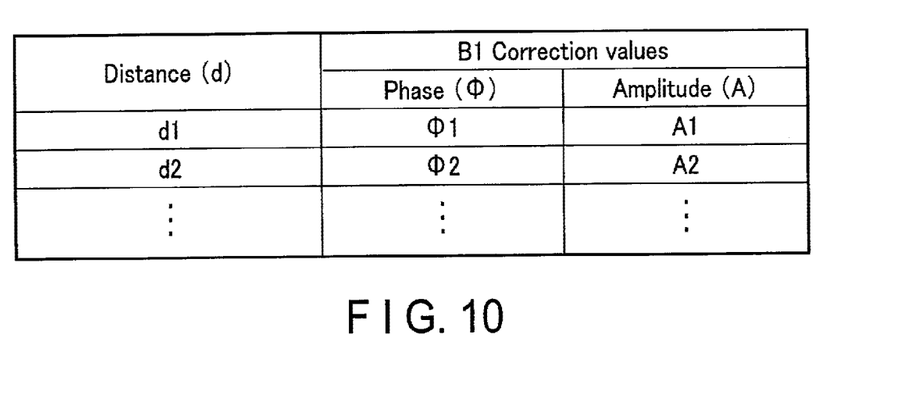
FIG. 10 is a diagram illustrating an example of a correspondence table of B1 correction values (for phase and amplitude) with respect to a distance in the relative positional relationship in the embodiment.

FIG. 10 is a diagram illustrating an example of the correspondence table of the B1 correction values (phase φ, amplitude A) with respect to a distance (d) in the relative positional relationship. If an angle (θ) is used as the relative position relationship, values of angles (θ) are provided in the leftmost column of the correspondence table shown in FIG. 10. If the position of the imaging target is used instead of the relative position relationship, values (coordinates) of the positions of the imaging target are provided in the leftmost column in the correspondence table shown in FIG. 10. The processing circuitry 150 determines the B1 correction values, referring to the correspondence table shown in FIG. 10, using the position of the imaging target specified by the specifying function 155. For example, if the distance dl is specified by the specifying function 155 as the relative position relationship, the processing circuitry 150 determines, by the determination function 157, the phase φ1 and the amplitude A1 of the RF pulse related to the transmit RF wave as the B1 correction values.

The storage circuitry 125 may store a predetermined calculation equation, instead of the correspondence table of B1 correction values. In this case, the processing circuitry 150 reads the predetermined calculation equation from the storage circuitry 125 by the determination function 157, and inputs a coordinate indicating the position of the imaging target, and an angle (θ) or a distance (d) as input values. Subsequently, the processing circuitry 150 determines the B1 correction values (for both of the phase and the amplitude, for the phase only, or for the amplitude only) by calculating the input values in the predetermined calculation equation.

In the correspondence table of B1 correction values, the B1 correction values may be associated with a subject's body type and the position of the imaging target. The predetermined calculation equation may be an equation for calculating the B1 correction values using a subject's body type and the position of the imaging target. A subject's body type is, for example, a weight and a height. The correspondence table of B1 correction values which are associated with the subject's body type and the position of the imaging target would have a format of the correspondence table shown in FIG. 10 with an additional column indicating the subject's body type. In this case, the processing circuitry 150 determines, by the determination function 157, the B1 correction values by the correspondence table or the calculation equation, using patient information of the subject P, in addition to the position of the imaging target. Specifically, in the process in step Sa1, the processing circuitry 150 causes, by the control function 151, the storage circuitry 125 to store the patient information of the subject P received from the RIS. Subsequently, in the process in step Sa3, the processing circuitry 150 specifies, by the specifying function 155, a subject P's body type based on the patient information. In the process in step Sa4, the processing circuitry 150 determines, by the determination function 157, the B1 correction values using the subject's body type, the position of the imaging target, and the correspondence table.

After determining the B1 correction values, the processing circuitry 150 may read, by the control function 151, the third imaging protocol from the storage circuitry 125. In this case, the processing circuitry 150 applies, by the control function 151, the B1 correction values determined by the determination function 157 to the third imaging protocol. Subsequently, the sequence control circuitry 110 controls the gradient magnetic field power supply 103 and each type of circuitry in accordance with the third protocol to which the B1 correction values are applied and the FOV, and performs imaging on the imaging target. The processing circuitry 150 generates, by the image generation function 153, the sensitivity map in the FOV based on the MR data collected by the third imaging protocol.

(Step Sa5)

After determining the B1 correction values, the processing circuitry 150 applies, by the control function 151, the B1 correction values determined by the determination function 157 to the second imaging protocol that is read from the storage circuitry 125. The sequence control circuitry 110 controls the gradient magnetic field power supply 103 and each type of circuitry in accordance with the second protocol to which the B1 correction values are applied and the FOV, and performs imaging on the imaging target. The processing circuitry 150 generates, by the image generation function 153, an MR image based on the MR data collected by the second imaging protocol to which the B1 correction values are applied (the MR image will be referred to as "an image obtained by main imaging" hereinafter). The processing circuitry 150 outputs the image obtained by main imaging to the display 123. The display 123 displays the image obtained by main imaging.

The processing circuitry 150 may correct, by the image generation function 153, brightness irregularity of the image obtained by main imaging using the sensitivity map. In this case, the processing circuitry 150 outputs the image obtained by main imaging for which brightness irregularity is corrected to the display 123. The display 123 displays the image obtained by main imaging for which brightness irregularity is corrected.

(Step Sa6)

When a target part having low flexibility in positioning is input, the processing circuitry 150 performs regular routine imaging. Specifically, the processing circuitry 150 determines, by the determination function 157, a pair of the B1 correction values that is predetermined for each targeted part, using the name of the targeted part that is input. Subsequently, the processing circuitry 150 applies, by the control function 151, the determined B1 correction values to the first to third imaging protocols that are read from the storage circuitry 125. The sequence control circuitry 110 performs imaging for positioning in accordance with the first imaging protocol to which the determined B1 correction values are applied. By the image generation function 153, the processing circuitry 150 generates a positioning image based on the MR data obtained by the imaging for positioning. An FOV of main imaging is input to the positioning image displayed on the display 123. Subsequently, the sequence control circuitry 110 collects MR data for a sensitivity map in accordance with the FOV and the third imaging protocol to which the determined B1 correction values are applied. The processing circuitry 150 generates a sensitivity map by the image generation function 153. Finally, the processing circuitry 150 performs main imaging by the control function 151 in accordance with the FOV and the second imaging protocol to which the determined B1 correction values are applied. The processing circuitry 150 generates, by the image generation function 153, an image obtained by main imaging based on the MR data related to the main imaging, and corrects brightness irregularity in the image obtained by main imaging, using the sensitivity map. The image obtained by the main imaging for which brightness irregularity has been corrected is displayed on the display 123.

According to the above-described configuration, the following advantageous effects can be obtained.

With the MRI apparatus 100 according to the present embodiment, if a part having high flexibility in positioning in the bore 111 is input as an imaging target, a position of the imaging target of the subject P in the bore 111 can be specified using images collected by a first imaging protocol (imaging for positioning), and in order to correct non-uniformity of the magnetic field of the transmit RF wave transmitted to the imaging target, the correction value (B1 correction value) for a phase and/or the correction value for an amplitude of an RF pulse of a transmit RF wave is determined in accordance with the specified position, and a second imaging protocol (main imaging) can be performed for a subject P using the determined correction values. For example, if one knee (one of two parts of a subject which are in a symmetrical position relationship) is an imaging target, the present MRI apparatus 100 can determine the B1 correction values, using a correspondence table of B1 correction values for the relative position relationship between the knees (a relative position relationship between the one part that is not an imaging target and the other part), for example, an angle θ (an angle between a straight line connecting the one part and the other part and a horizontal direction) or a distance d (a distance from a horizontal line passing the lower edge of the outline of the other part to the one part), or using a predetermined calculation equation that calculates the B1 correction values based on the relative position relationship of the knees as input values. Furthermore, the MRI apparatus 100 according to the present embodiment can determine the B1 correction values, using information of an FOV in a positioning image, for example, a position of an imaging target with respect to the center of magnetic field BC, and the correspondence table of B1 correction values for the position of the imaging target, or using the information of an FOV and the predetermined calculation equation for calculating the B1 correction values using a coordinate of the position of the imaging target as an input value.

As described above, according to the present MRI apparatus 100, even if an imaging target has high flexibility in positioning in the bore 111, it is possible to determine optimum B1 correction values in accordance with a position of the target in the bore 111, without performing pre-scanning to obtain a spatial distribution of B1. Thus, according to the present MRI apparatus 100, it is possible to perform B1 shimming with improved accuracy in correcting non-uniformity of B1, without extending the time for the entire imaging process, and to obtain an optimum B1 distribution for MR imaging. For the above reasons, with the MRI apparatus 100 according to the present embodiment, an optimum B1 distribution for MR imaging can be obtained, without degrading examination throughput, thereby suppressing brightness irregularity in an MR image and improving image quality.

Furthermore, with the MRI apparatus 100 according to the present embodiment, a result of the detection of an imaging target in a positioning image, i.e., the position of an imaging target in the positioning image, can be corrected in accordance with an operator's instruction of correction that is input through the input interface circuitry 121, or a GUI, etc., and the B1 correction values can be determined in accordance with the corrected position of the imaging target. In other words, with the MRI apparatus 100 according to the present embodiment, fine adjustment of a position of an imaging target, and improvement of accuracy in the B1 correction values which are used for B1 shimming can be achieved. Thus, according to the present MRI apparatus, brightness irregularity in an MR image can be suppressed and quality of image can be further improved.

With the MRI apparatus 100 according to the present embodiment, the B1 correction values can be determined by a correspondence table or a calculation equation, further using patient information of a subject P. In other words, according to the present embodiment, since the B1 correction values are determined in consideration of a subject P's body type, accuracy of the B1 correction values used in B1 shimming can be improved. Thus, according to the present MRI apparatus, brightness irregularity in an MR image can be suppressed and image quality can be further improved.

(Modification)

The difference from the above-described embodiment lies in that the correspondence table of B1 correction values with respect to the position of the imaging target, or the predetermined calculation equation, is adjusted based on a past image of the same subject P obtained by main imaging.

The storage circuitry 125 stores a past image of the same subject P obtained by main imaging. The B1 correction values that were used to collect a past image obtained by main imaging are added to the past image as supplementary information. The storage circuitry 125 may store B1 correction values related to the past image obtained by main imaging, along with the past image itself. The past image obtained by main imaging may be read from the PACS, etc. via a network. For example, if patient information of a subject P is received from the RIS, the processing circuitry 150 reads, by the control function 151, a past image of the subject P obtained by main imaging from the PACS, etc. based on the patient information, and causes the storage circuitry 125 to store the past image. The storage circuitry 125 stores a plurality of thresholds for distinguishing an extent of brightness irregularity. The storage circuitry 125 may store a threshold for determining presence/absence of brightness irregularity in the past image obtained by main imaging. The storage circuitry 125 stores a correction correspondence table of corrected values for the B1 correction values, and the corrected values correspond to extents of brightness irregularity. The storage circuitry 125 may store a correction calculation equation for calculating correction values for the B1 correction values in accordance with an extent of brightness irregularity.

In order to correct the non-uniformity of the magnet field of the transmit RF wave in the imaging target, the processing circuitry 150 adjusts, by the adjustment function 159, the correspondence table or the calculation equation based on a result of past imaging performed by the second imaging protocol. Specifically, the processing circuitry 150 digitizes the brightness irregularity of the imaging target in the past image obtained by main imaging by predetermined imaging processing. Predetermined imaging processing is, for example, mutual relative processing between adjacent local regions in the past image obtained by main imaging. The processing circuitry 150 determines an extent of the brightness irregularity by comparing the digitized brightness irregularity with a plurality of thresholds. An extent of brightness irregularity corresponds to an index indicating a level of the brightness irregularity. The determining of an extent of brightness irregularity is not limited to the above-described procedures; a variety of theories of digitization may also be adopted. The processing circuitry 150 adjusts the correspondence table or the calculation equation related to the B1 correction values based on the extent of the brightness irregularity and the correction correspondence table. The processing circuitry 150 may determine a presence/absence of brightness irregularity by comparing a digitized brightness irregularity with an brightness irregularity determination threshold, by the adjustment function 159. If it is determined that a brightness irregularity is present, the processing circuitry 150 adjusts the correspondence table or the calculation equation related to the B1 correction values so as to increase the B1 correction values by a predetermined value.

According to the above-described configuration, the following advantageous effects can be obtained.

With the MRI apparatus 100 according to the present modification, the correspondence table or the calculation equation used for determining correction values can be adjusted in order to further correct non-uniformity in the imaging target based on a result of past imaging by the second imaging protocol. In other words, according to the present modification, a correspondence table of B1 correction values or predetermined calculation equation for the position of the imaging target can be adjusted in accordance with an extent of brightness irregularity in the past image of the same subject P obtained by main imaging. According to the present modification as described above, an extent of brightness irregularity in the past image of the same subject P obtained by main imaging can be fed back to the adjustment of the B1 correction values provided in the correspondence table or the calculation equation. Therefore, with the MRI apparatus 100 according to the present modification, the correspondence table or the calculation equation can be updated for each subject, thereby further improving the correction of non-uniformity in the B1.

Applied Examples

An applied example is applied to a case, for example, where an imaging target is the trunk in an abdomen of the subject P, and a coronal cross section of the trunk (the direction of the longitudinal axis of the trunk in an axial cross section) is tilted with respect to the surface (e.g., a horizontal line) where the subject P is laid on the couch top 104. In this case, for example, pads (the pads 104a, 103c, 104d, etc.) are placed between the subject P and the couch top 104a. An imaging target is not limited to the abdomen.

Figure 11:
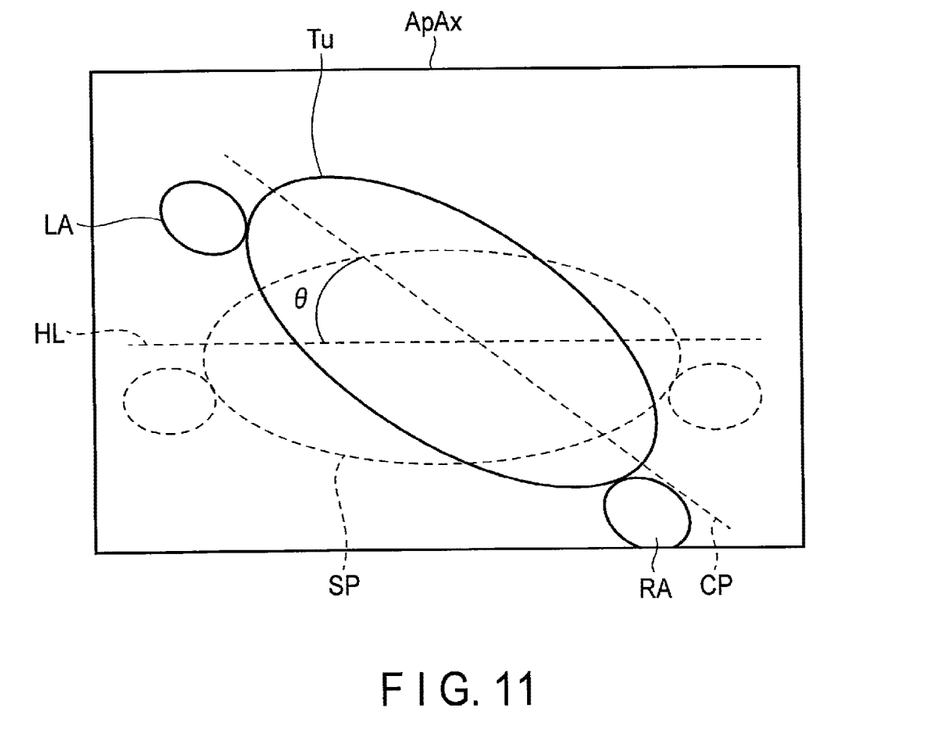
FIG. 11 is a diagram illustrating an example of an axial image as a positioning image in an applied example of the embodiment.

FIG. 11 is a diagram illustrating an example of the axial image ApAx as a positioning image in the present applied example. As shown in FIG. 11, the trunk Tu in the axial image ApAx is tilted at an angle of θ with respect to the horizontal line HL, in comparison to the trunk SP in the supine position. The angle θ is an angle between the horizontal line HL and the coronal cross section CP of the trunk Tu.

The storage circuitry 125 stores a correspondence table of B1 correction values for the angle θ with respect to the horizontal line of the imaging target in the axial image as a positioning image. In the correspondence table in the present applied example, a value of the angle θ is presented in the column of distance (d) shown in FIG. 10, and the correspondence table is stored in advance for each imaging target. In other words, a correspondence table is a table showing a correspondent relationship between B1 correction values (phase φ and amplitude A) and each angle (θ) for each imaging target.

The B1 shimming function in the present applied example will be described below.

As a target part to be imaged, "abdomen" is input via the input interface circuitry 121. An instruction to select an imaging protocol for the abdomen may be input instead of an input of a target part to be imaged. Before executing the first imaging protocol for the abdomen, a pad 104b is placed on the couch top 104a. A pad 104c is placed between the trunk Tu and the pad 104b. A pad 104d is placed between the left arm LA and the pad 104c. Inserting pads provided between the couch top 104a and the subject P is not limited to hereto. Tilting the coronal cross section CP of the trunk Tu with respect to the horizontal line HL is effective when it is difficult for the subject P who is lying upon the couch top 104a to maintain their position, e.g., a supine position, a prone position, or a lateral recumbent position due to pain, etc.

The sequence control circuitry 110 executes the first imaging protocol. By executing the first imaging protocol, the processing circuitry 150 generates a positioning image ApAx, like the one shown in FIG. 11.

The processing circuitry 150 specifies, by the specifying function 155, the trunk Tu of the subject P in the axial image ApPx shown in FIG. 11. For example, the processing circuitry 150 detects an outline of the trunk Tu in the axial image ApAx shown in FIG. 11 by an image processing function, such as an edge detecting processing. Subsequently, the processing circuitry 150 specifies the coronal cross section CP of the trunk Tu based on the outline of the trunk Tu for an imaging target and anatomical landmarks in the trunk Tu. The processing circuitry 150 may specify the longitudinal direction of the outline of the trunk Tu in the axial image ApAx, instead of the coronal cross section CP, based on the outline of the trunk Tu. As a relative position relationship, the processing circuitry 150 specifies the angle θ between the coronal cross section CP or the direction of the longitudinal axis of the trunk and the horizontal line HL.

After specifying the angle θ of the imaging target, the processing circuitry 150 reads, by the determination function 157, the correspondence table of B1 correction values from the storage circuitry 125 in accordance with the target part to be imaged. Subsequently, the processing circuitry 150 determines the correction value (B1 correction value) for the phase and/or the correction value for the amplitude, based on the correspondence table and the angle θ specified by the specifying function 155.

If a predetermined calculation equation is stored in the storage circuitry 125 instead of the correspondence table of B1 correction values, the processing circuitry 150 reads, by the determination function 157, the predetermined calculation equation from the storage circuitry 125. Subsequently, the processing circuitry 150 inputs the angle θ to the read calculation equation and calculates the equation to determine the B1 correction value (for both of the phase and the amplitude, for the phase only, or for the amplitude only).

After determining the B1 correction value, the processing circuitry 150 applies, by the control function 151, the B1 correction value determined by the determination function 157 to the second imaging protocol that is read from the storage circuitry 125. The sequence control circuitry 110 controls the gradient magnetic field power supply 103 and each circuitry in accordance with the second imaging protocol to which the B1 correction value is applied and the FOV that is set by the operator to perform imaging on the trunk Tu which is a target part to be imaged.

As another applied example, the B1 shimming function described in the foregoing embodiment can be executed based on a software program. The B1 shimming function described in the foregoing embodiment are stored in a magnetic disc (flexible disc, hard disc, etc.), an optical disc (CD-ROM, CD-R, CD-RW, DVD-ROM, DVD±R, DVD±RW, etc.), a semiconductor memory, or a similar storage medium, as a program executable by a computer. As long as a storage medium is readable by a computer or a built-in system, any storage type can be adopted. In this case, the above-described B1 shimming function can be realized if a computer reads a program from the storage medium, and executes the instructions written in the program on the CPU based on the program. Furthermore, the storage medium is not limited to a medium independent from a system or a built-in system; a storage medium storing or temporarily storing a program downloaded through LAN (local area network) or the Internet, etc. is also included as the storage medium according to the present embodiments. Furthermore, a storage medium is not limited to one; when the B1 shimming function is carried out in multiple storage media, these storage media are included as a storage medium according to the present embodiments, and can take any configuration.

According to the above-described MRI apparatus 100, B1 shimming can be performed appropriately for an imaging target placed in a bore.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
   processing circuitry configured to
      specify a position of an imaging target of a subject in a bore, using an image collected by a first imaging protocol,
      determine, in accordance with the specified position, a correction value for a phase of an RF pulse and/or a correction value for an amplitude of the RF pulse so that non-uniformity in a transmit RF magnetic field caused by the RF pulse wave transmitted to the imaging target is correctable; and
   sequence control circuitry configured to execute a second imaging protocol for the subject, using the determined correction value, wherein
   the imaging target is one part of two parts, the two parts having a symmetric position relationship, and the processing circuitry uses a relative position relationship between the one part and the other part which is not an imaging target among the two parts to determine the correction value.

2. The magnetic resonance imaging apparatus according to claim 1, wherein
the relative position relationship is an angle between a straight line connecting the one part and the other part and a horizontal direction.

3. The magnetic resonance imaging apparatus according to claim 1, wherein
the relative position relationship is a distance from a horizontal line passing a lower edge of an outline of the other part to the one part.

4. The magnetic resonance imaging apparatus according to claim 1, wherein
the processing circuitry detects the imaging target from the image,
the magnetic resonance imaging apparatus further comprises
a display configured to display the detected imaging target on the image; and
input interface circuitry configured to receive an input of an instruction to correct the position of the imaging target in the image, and
the processing circuitry uses the position of the imaging target which is corrected by the input to determine the correction value.

5. The magnetic resonance imaging apparatus according to claim 1, wherein
the image is a positioning image for determining a position for imaging by the second imaging protocol, and
the processing circuitry specifies the position based on information of a field of view for imaging which is determined by an operator in the positioning image.

6. The magnetic resonance imaging apparatus according to claim 1, wherein
the processing circuitry is configured to
determine the correction value by a correspondence table of the correction value and the position, or a calculation equation for calculating the correction value using the position, and
adjust the correspondence table or the calculation equation used for determining the correction value based on a result of past imaging by the second imaging protocol, so that the non-uniformity in the imaging target is further correctable.

7. The magnetic resonance imaging apparatus according to claim 6, wherein
the correction values are associated with a body type of the subject and the position in the correspondence table,
the calculation equation is an equation for calculating the correction value using the subject's body type and the position, and the processing circuitry further uses patient information related to the subject to determine the correction value by the correspondence table or the calculation equation.

8. The magnetic resonance imaging apparatus according to claim wherein
the processing circuitry further uses a center of a magnetic field in the bore to specify the position.

9. The magnetic resonance imaging apparatus according to claim 1, wherein
the sequence control circuitry executes a third imaging protocol for collecting a sensitivity map using the determined correction value, and
the processing circuitry generates an MR image related to the imaging target using the MR data collected by the second imaging protocol, and corrects brightness irregularity of the MR image, using the sensitivity map.

10. A non-transitory computer-readable storage medium including computer executable instructions, wherein the instructions, when executed by a computer, cause the computer to perform a method, the method comprising:
specifying a position of an imaging target of a subject in a bore, using an image collected by a first imaging protocol;
determining, in accordance with the specified position, a correction value for a phase of an RF pulse and/or a correction value for an amplitude of the RF pulse so that non-uniformity in a transmit RF magnetic field caused by the RF pulse transmitted to the imaging target is correctable; and
executing a second imaging protocol for the subject, using the determined correction value, wherein
the imaging target is one part of two parts, the two parts having a symmetric position relationship, and
the determining uses a relative position relationship between the one part and the other part which is not an imaging target among the two parts to determine the correction value.

11. A method comprising:
specifying a position of an imaging target of a subject in a bore, using an image collected by a first imaging protocol;
determining, in accordance with the specified position, a correction value for a phase of an RF pulse and/or a correction value for an amplitude of the RF pulse so that non-uniformity in a transmit RF magnetic field caused by the RF pulse transmitted to the imaging target is correctable; and
executing a second imaging protocol for the subject, using the determined correction value, wherein
the imaging target is one part of two parts, the two parts having a symmetric position relationship, and
the determining uses a relative position relationship between the one part and the other part which is not an imaging target among the two parts to determine the correction value.

* * * * *